US 6,522,518 B1

(12) United States Patent
Barnett

(10) Patent No.: US 6,522,518 B1
(45) Date of Patent: Feb. 18, 2003

(54) RECONFIGURABLE MULTICHIP MODULE STACK INTERFACE

(75) Inventor: David M. Barnett, Littleton, CO (US)

(73) Assignee: Lockhead Martin Corporation, Bethesda, MD (US)

( * ) Notice: Subject to any disclaimer, the term of this patent is extended or adjusted under 35 U.S.C. 154(b) by 306 days.

(21) Appl. No.: 09/621,151

(22) Filed: Jul. 21, 2000

Related U.S. Application Data

(60) Provisional application No. 60/145,448, filed on Jul. 23, 1999.

(51) Int. Cl.$^7$ ............................................... H01H 47/32
(52) U.S. Cl. ........................ 361/188; 257/691; 257/698; 257/700
(58) Field of Search ........................... 361/188; 257/691, 257/698, 700

(56) References Cited

U.S. PATENT DOCUMENTS

| | | | | |
|---|---|---|---|---|
| 5,854,534 A | * | 12/1998 | Beilin et al. ................ | 257/691 |
| 6,137,167 A | * | 10/2000 | Ahn et al. ................... | 257/208 |
| 6,274,937 B1 | * | 8/2001 | Ahn et al. ................... | 257/723 |

OTHER PUBLICATIONS

"Design, Modeling, and Performance of a High Force Piezo-electric Inchworm Motor" Galante, et al., Jun. 29, 2000, Internet Article at www.personal.psu.edu (14 Pages).

"A Piezoelectric Linear Vibration for High Driving Forces" Hemsel, et al., Jun. 29, 2000, Internet Article at www.jega.ktu.lt (11 Pages).

* cited by examiner

*Primary Examiner*—Bao Q. Vu
(74) *Attorney, Agent, or Firm*—Marsh Fischmann & Breyfogle LLP

(57) ABSTRACT

A system and apparatus provide for the packaging of electronic components as well as a monitoring system to periodically check and adjust connections between the various electronic components. A multichip module (MCM) may be employed with an interposer and circuit card interface to comprise an electronic assembly. Each of the components in the assembly includes external electrical contacts which provide for the conduction of electrical signals between the components as well as to remotely located systems. The electronics assembly further includes an actuator assembly which is employed to apply a compressive force to the electronic components in a stacked configuration and to periodically measure the resistance over a feedback circuit to determine that there is still a good electrical connections between the contacts. If the measured resistance is above a predetermined level, the compressive force may be increased to improve the electrical connections.

37 Claims, 11 Drawing Sheets

RECONFIGURABLE MULTICHIP MODULE STACK INTERFACE

RELATED APPLICATIONS

This patent application relates to U.S. provisional patent application Ser. No. 60/145,448 filed on Jul. 23, 1999.

FIELD OF INVENTION

The invention described herein related to the packaging of electronic processing components in a computer system, and more particularly to an apparatus which provides for the monitoring and modification of electrical connections between the electronic processing components.

BACKGROUND OF THE INVENTION

As airplane and spacecraft have become more technologically sophisticated, there has been a greater need to include more electronic components on the vehicles. For example, avionics systems which are employed to control flight and other aspects of the aircraft and/or spacecraft, require a great number of electronic processing components as well as input/output and interconnected signal lines so that the various components may communicate.

Typically, an aircraft or spacecraft will carry a number of "black boxes" which include circuit cards designed to perform particular functions. A number of circuit cards may be positioned in each black box and electrical connections provided from each circuit card. These electrical connections may be made to a motherboard, which in turn provides for communication from a particular black box with any number of remotely located systems.

The integrated circuits which are employed in the black boxes described above may be packaged in what is known as a multichip module (MCM). A MCM is a chip carrier within which various computer chips may be located with electrical connections provided between chips as well as to external components. Most commonly, these multichip modules are incorporated in multi-layer dielectric substrates that employ thin film processes for form electrically conductive traces to interconnect the various chips. The multi-layer dielectric substrates are made employing techniques that have been initially developed for various types of semi-conductive type processing. These MCMs may include high density interconnect (HDI) technology. In an MCM, many chips may be connected in close proximity to each other.

SUMMARY OF THE INVENTION

When MCM's or other electronic components are included in an electronic assembly, a typical configuration is incorporate external electrical contacts on the outside surfaces of these components and to stack these items in a manner such that desired electrical connections are established. Once the components are aligned, a compressive force may be applied to hold the assembly together. One draw-back of this configuration is that over time the physical characteristics of the external electrical contacts may deteriorate such that electrical resistance across the contacts may vary. The inventor has recognized that certain apparatus may be provided with the electronic assembly and certain steps performed during operation of the electrical components such that good electrical connections may be maintained.

Described herein is an electronics apparatus which includes the functionality for measuring the quality of certain electrical contacts within a stacked electronic assembly and for performing certain steps to improve the conductivity through these contacts when detected resistance rises above a pre-determined level. Included in the apparatus are a plurality of electronic components wherein each of these components has at least one external electrical contact. Running through each of the electronic components are conductive traces which comprise a feedback circuit over which pre-determined current may be transmitted such that a voltage drop over the circuit may be measured. This measurement may be converted to a resistance calculation for the circuit.

Further included in the electronics apparatus may be a force actuator device which is in electrical connection with the resistance measurement device. The force actuator device may include at least one force actuator which is positionable on the electronic assembly such that it may exert a compressive force on the stacked electrical components when activated. This activation may be in response to receipt of a control signal from the resistance measurement device.

In one configuration of the invention, the electronic assembly components may include a multichip module (MCM), an interposer, and a circuit card interface for providing interconnection of the electronic assembly with remotely located systems. These electronic components may be in a stacked configuration such that the external electrical contacts on the external surfaces of each of the components are in contact with each other. In the stacked configuration, the interposer is positioned between the MCM and the circuit card interface. The interposer is configured such that the electrical contacts run through the thickness of this component. The contacts may be shaped such that when a compressive force is applied to said contacts, the external portions of the contact move in a desired fashion. In one configuration of the invention, these components may have a "Z" shape.

To provide for the application of a compressive force to the electronic assembly described herein, a base plate structure may be provided wherein this structure includes a plurality of alignment pins extending therefrom. Incorporated into the other components of the assembly described herein, may be alignment holes through which said pins may pass. When the components are in the stacked configuration and the alignment pins are running through each component, the external electrical contacts on each of the components shall be in electrical connection with their electrical contacts.

On the opposite side of the stacked configuration from the base plate structure may be the resistance measurement device and force actuator assembly in a self-contained structure. This structure may be configured such that it includes apparatus for receiving and engaging the alignment pins. The alignment pins may be received by specially configured force actuation motors which contact the alignment pins and apply a force to said alignment pins such that a desired compressive force is applied to the stacked electronic assembly. In one configuration of the invention, the force actuator devices may comprise piezoceramic inchworm motors which attempt to move along the alignment pins in response to a received voltage. In another configuration of the invention, the force actuators may comprise at least one shape memory alloy motors positioned relative to the stacked electronic assembly which is in electrical connection with a controller such that the motors moves in a fashion such that a variable compressive force is applied to the stacked electronic assembly. In yet another configuration of the invention, electromechanical actuators may be physically attached to the exterior surfaces of the electronic assembly where an electrical connection is established between the actuators and an electronic controller.

In yet another configuration of the invention, the current source, voltage measuring device, and force actuator may be incorporated into a microprocessor. This microprocessor may include external pins or connectors for establishing a connection with the feedback circuits as well as the force actuators which are employed.

The stacked electronic assembly described herein may be further be employed in a specially adapted system for loading and unloading MCMs. Included in this apparatus is a black box structure for holding a plurality of stacked electronic assemblies. Electrical connections are provided through the black box structure such that electrical signals may be transmitted via the circuit card interface to remotely located structures. In connection with the black box structure is a movable MCM magazine which is electrically controllable to move in a desired direction relative to position of electronic assemblies within the MCM stack structure. Further, an MCM insert/remove actuator is employed in conjunction with the MCM magazine such that one MCM can be removed from the stacked electronic assembly and a new one inserted. The MCM stacked structure can be configured such that electronic signals may be transmitted to the force actuator such that the alignment pins may be released and the base plate structure and alignment pins removed from the stacked assembly. The MCM which is to be replaced may then be removed and a new one replaced through the use of the insert/remove actuators.

In operation, the electronic assembly described herein may be first assembled by positioning the electronic devices such that the external electrical contacts are in contact with electrical contacts of the other electronic components. This may be done by having the alignment pins of the base plate structure pass through the alignment holes of each of the electronic components. Once this device is assembled and in operation mode, a current of a pre-determined magnitude may be periodically transmitted through the above-described feedback circuit. A voltage measurement device employed in conjunction with the current source may then measure the voltage drop over the feedback circuit. If the measured voltage drop is greater than a pre-determined value, this would indicate that the resistance across the electrical contacts is greater than desired. In response to detection of the high resistance, a control signal may in turn be transmitted to the force actuators which are employable for exerting a compressive force on the stacked components of the electronic assembly. As the compressive force is applied, additional measurements may be made across the feedback circuit to provide additional measurements of the resistance. Once the resistance is less than a pre-determined value, the change in compressive force may be stopped.

The system described herein may be programmed such that the current transmission and voltage measurement may be performed at pre-determined intervals. Further, the system may also be configured such that the current transmission is controlled manually and may be initiated by a user interface remotely located from the electronic assembly but in electrical connection.

The system may be further configured such that a compressive force is applied to the stacked electronic assembly through the force actuators. This force provides for moving the electrical contacts in the interposer in a lateral direction such that a scrubbing action occurs between said contacts and the electrical contacts on other electronic components. This scrubbing action acts to remove any substances which are increasing the resistance across the contacts.

DETAILED DESCRIPTION

Figure 1:
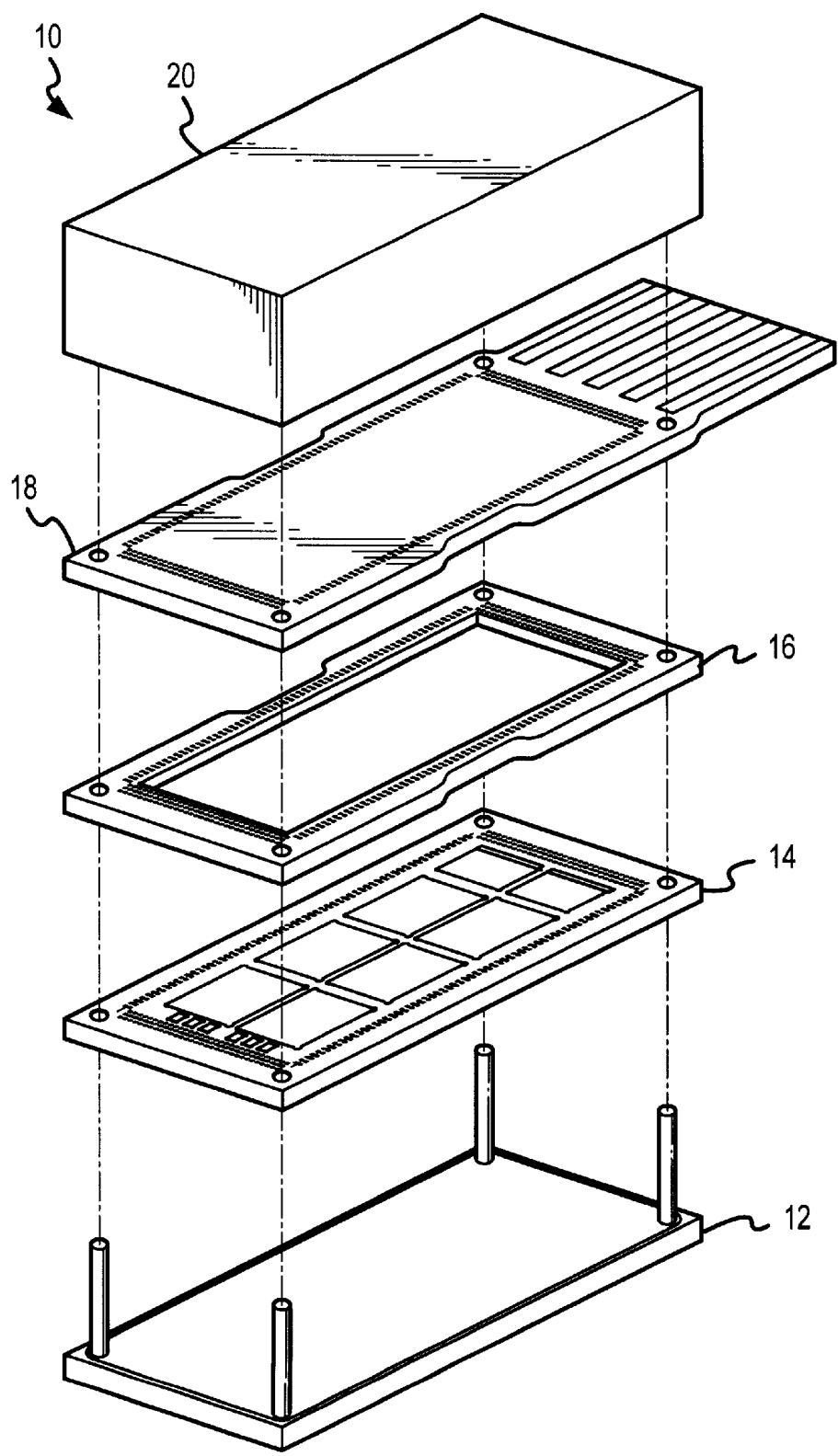
FIG. 1 discloses an exploded view of the electronic assembly described herein.

Disclosed in FIG. 1 is an exploded view of the electronic assembly 10. The electronic assembly 10 is a specially designed apparatus which is configured to hold a number of processing elements which may be used in computer systems for aircraft and spacecraft. Electronic assembly 10 may include a number electronic processing components as well as conductive pathways for routing signals to and from the components, as well as to remotely locate computer systems. The electronics assembly disclosed in FIG. 1 includes a multichip module (MCM) 14 which is configured to hold a number of electronic processing components, such as semiconductor chips. Further included in the module are conductive traces for establishing electrical communications between the chips, as well as between the chips and external systems. MCM's perform the functions of what circuit card assemblies previously performed, but in a more compact fashion. A more detailed description of the MCM 14 is provided below.

Adjacent to the MCM 14 is the interposer 16. The interposer 16 acts as a signal pathway for conducting signals between the MCM 14 and the circuit card interface 18. The circuit card interface 18 provides for the routing of electrical signals to and from components in the electronic assembly. Shown in FIG. 1 is the substantially rigid portion of the circuit card interface 18 which contacts the interposer 16. The circuit card interface may include a flexible portion (not shown in this view) which is connected to other electronic assemblies and/or remotely located systems.

Adjacent to the MCM 14 is base frame 12 which is configured to receive the MCM, the interposer, and the motherboard when in a stacked configuration. The base frame includes alignment pins which extend outward and upon which the various components of the electronic assembly (which include alignment holes) may be positioned. The base frame may further include a recessed area which is configured to receive one or more of the electronic components. Opposite the electronic assembly from the base plate structure 12 is the force actuator assembly 20. This force actuator assembly, when in connection with the support pole extending from the base plate structure, may exert a compressive force on the electronic assembly when in a stacked configuration.

The electronic assembly described above may be employed in a number of environments including on-board spacecraft and aircraft. As is known, electronic processing components for aircraft or spacecraft are provided through use of circuit card assemblies which are packaged in "black" boxes. Because space is at a minimum on these types of crafts and lightweight components are desirable, it is becoming increasingly difficult to find sufficient space to locate black boxes, especially in light of the increases in the number of systems which an aircraft or spacecraft may employ.

When employing a stacked structure such as the one disclosed in FIG. 1, one difficulty may be encountered is maintaining good electrical connections between the various components. Electrical connections may be affected by the vibrations encountered during the craft operations or simply through the long term use of the contacts. Typically, electrical contact between the various components is maintained through the use of compressive force. In one configuration, nut and bolts may be employed to apply the necessary compressive force in order to establish and maintain contact between the electronic components. This compressive force is applied during assembly of the stack and be maintained during the life of the assembly as long as there are no external forces for which may disrupt it. As electronic assembly operates in extreme environments such as an aircraft or spacecraft, the environmental forces may affect the electronic assembly such that the initial compressive force applied is not sufficient in order to maintain good electrical contact between the various electronic components. As such, it may be desirable to vary this compressive force during operation of the electronic assembly.

Figure 2:
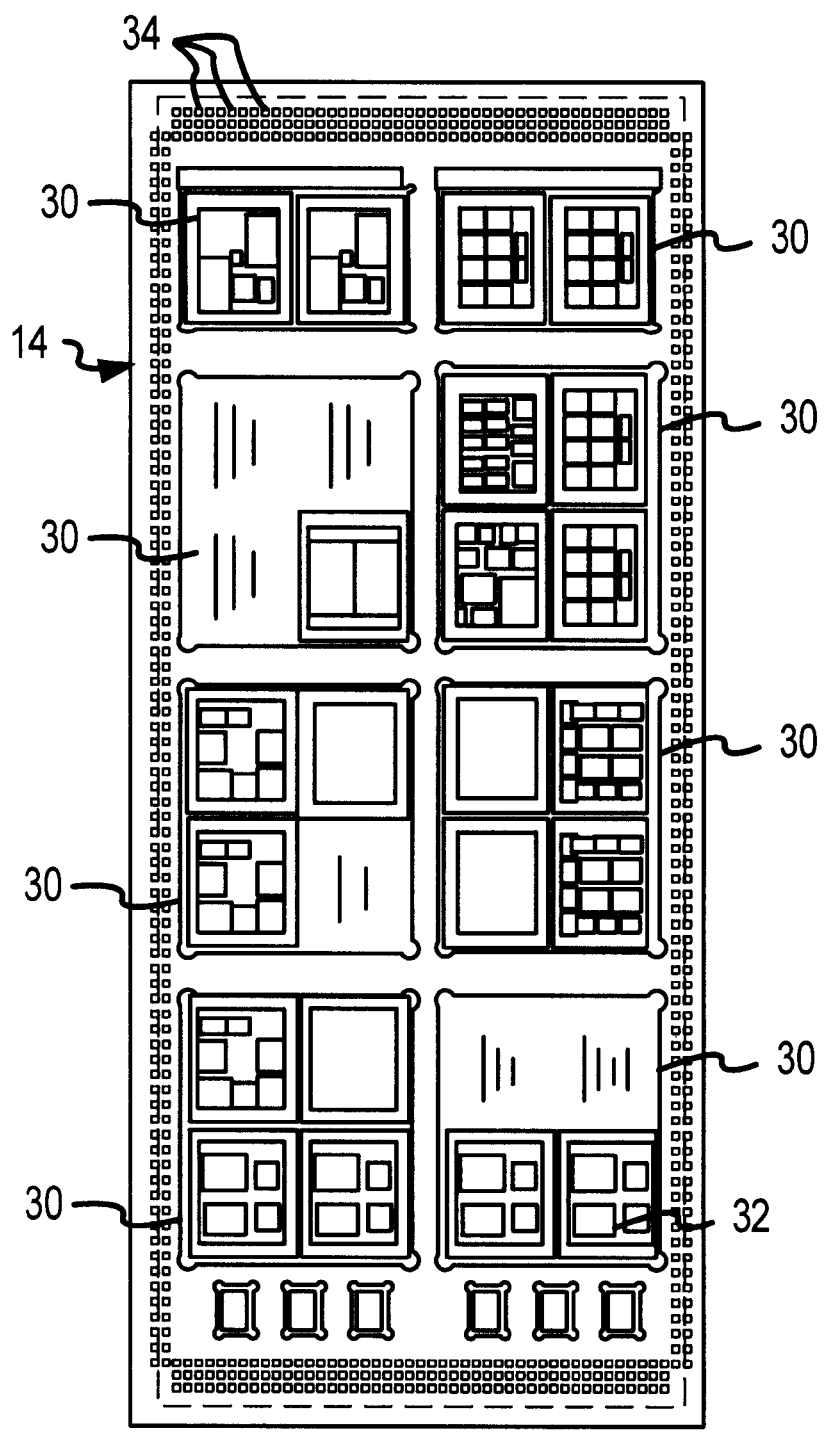
FIG. 2 discloses a plan view of the multichip module.

Disclosed in FIG. 2 is a top view of the HDI module 14. As can be seen, the HDI module 14 includes a number of sub-modules 30 which further include a number of processing chips 32. In order to communication outside the module, data and other signals may be routed through the external electronic contacts 34 which run along the outer surface of the HDI module. These contacts are made of a conductive metal, and protrudes slightly above the surface of the HDI module. The HDI module 14 is sized such that it may fit within the recess of the bracket 12. The tolerance of the recess in the bracket and the HDI module may be such that the HDI module will not move significantly when the assembly is in an operating environment, and the coefficient of expansion of the two components may be compatible to avoid excess movement or inducement of stress when heating or cooling of the electronic assembly occurs.

Figure 3A:
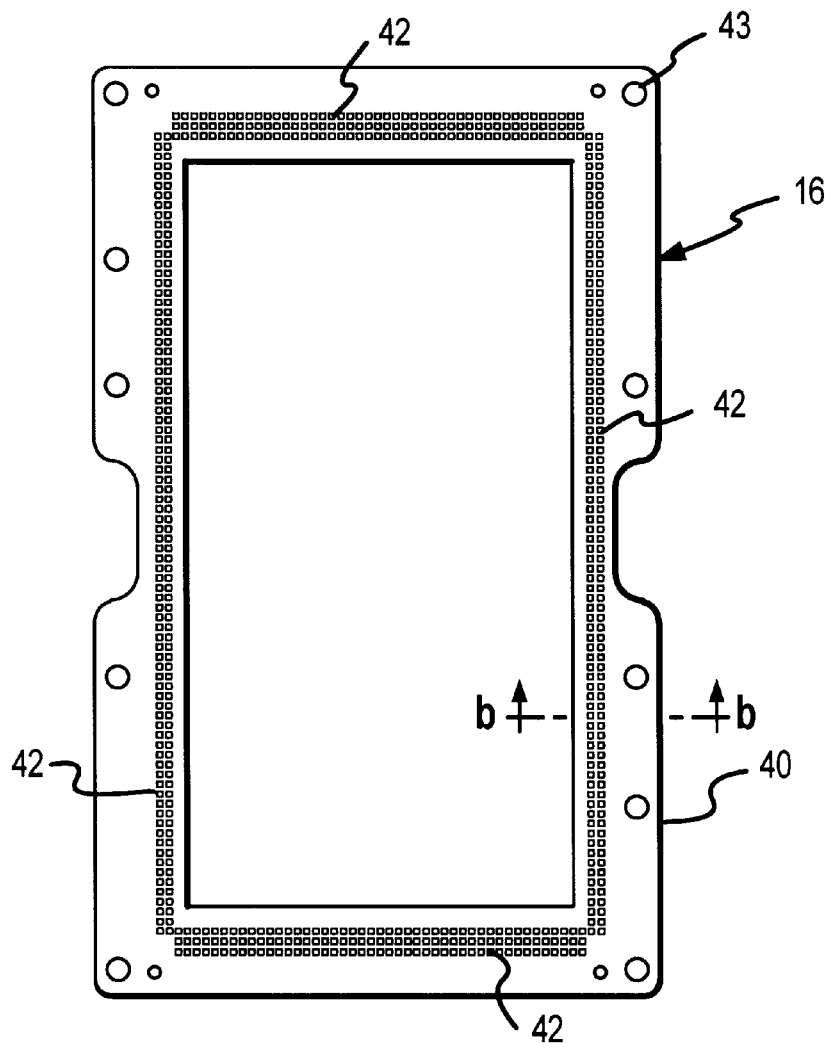
FIG. 3 discloses a plan view of the interposer.

Disclosed in FIG. 3A is a top view of the interposer 16. As was seen in FIG. 1, when the electronic assembly is constructed, the interposer is positioned between the MCM 14 and the circuit card interface 18. In the configuration shown in FIG. 3a, the interposer body 40 is constructed from a relatively thin sheet of hard plastic. Passing through the interposer are a number of electrical contacts 42 which provide for the conduction of electrical signals from one side of the interposer to the other. The opposite side of the interposer (not shown) is substantially identical to the side shown in FIG. 3, and includes the same pattern for the electrical contacts. The electrical contacts may be made of a beryllium copper which is plated with gold and includes compressed characteristics such that when pressure is applied to the conductive contacts an expansive force is generated between contacts and the bodies which may be in contact such that an electrical connection is maintained.

Figure 3B:
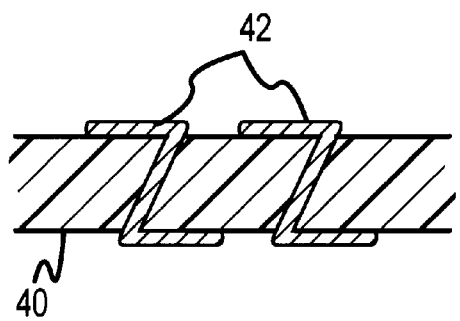

Disclosed in FIG. 3b is a cross sectional view of the electrical contacts 42. As can be seen, the contacts have a "Z" shape. This shape is desirable in that when a compressive force is applied to the top and bottom of these contacts, a lateral force (parallel to the upper and lower surfaces of the interposer) is induced. Through application of the lateral force some movement of the contacts may occur. The amount of movement of the contacts can be controlled through the amount of compressive force applied.

Certain considerations need to account for with regards to the design of the interposer. As a first consideration, electrical contacts may be laid out in such a pattern that they match the contact pattern of the HDI module 14. The interposer must be designed in a fashion such that there is not significant expansion or contraction of materials during changes of heat. Further, the alignment holes 43 must be positioned such that the alignment pin extending from the base plate structure may pass therethrough.

Figure 4:
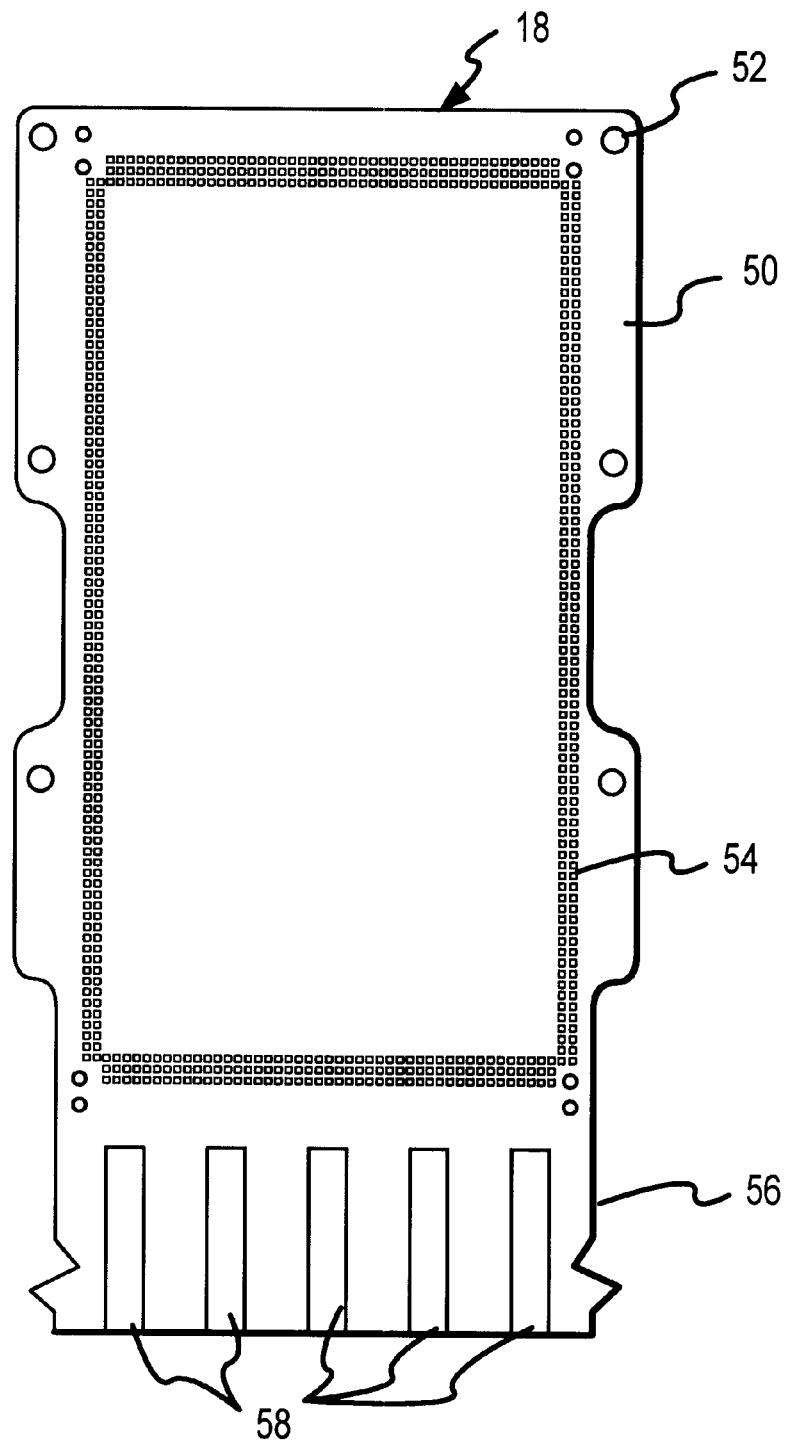
FIG. 4 discloses a plan view of the integrated circuit interface.

Disclosed in FIG. 4 is a top view of the circuit card interface 18. The circuit card interface 18 may be constructed of layered Kapton, and embedded within the circuit card interface are a number of conductive contacts and circuit traces which are employed to carry signals to and from the electronic assembly. The motherboard may comprise a rigid portion 50 and a flexible portion 56. The rigid portion 50 will contact the interposer in the electronic assembly while the flexible portion 56 will be used to establish connections with remotely located systems and/or devices.

The circuit card interface includes a member of electrical contacts 54 which protrude from the surface of the motherboard. These electrical contacts may also be constructed of conductive metal, and possess compressive characteristics such that when a force is applied to the contacts, they will maintain electrical contact with whatever surface or object is applying a force. Conductive traces within the circuit card interface (not shown) may conduct electrical signal to and from the electrical contacts. The circuit traces 58 pass through the flexible portion and carry electrical signals to and from other systems and/or devices.

As with the electrical contacts on the interposer, electrical contacts 54 on the circuit card interface are laid out such that they align with corresponding electrical contacts on the interposer. The motherboard is constructed of a material whose coefficient of expansion is compatible with the other components in the electronics assembly. Further, the circuit card interface may include alignment holes 52 through which the alignment pins extending from the support racket may pass.

Figure 5:
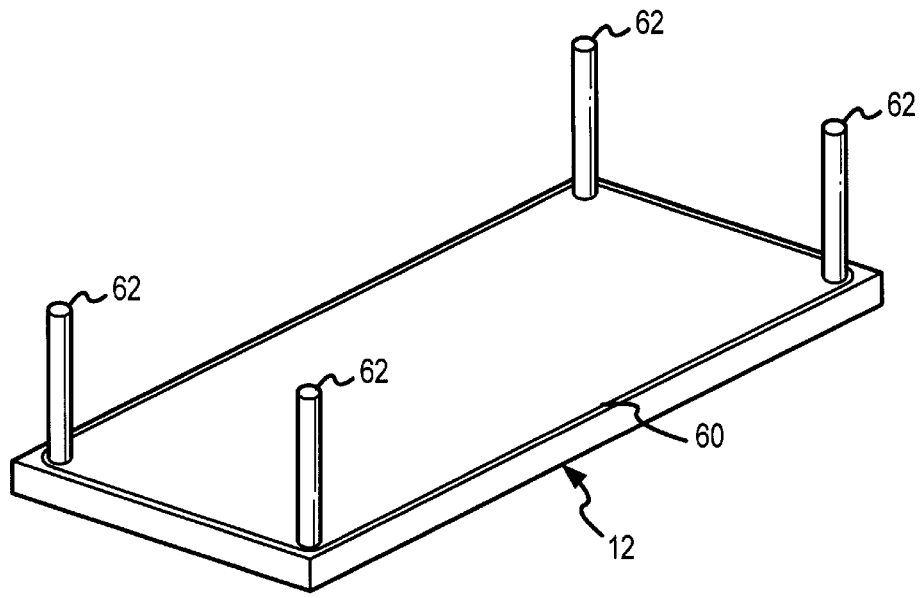
FIG. 5 discloses a perspective view of the base plate structure.

Disclosed in FIG. 5 is a perspective view of the base plate structure 12. The base plate may be made of a material such as machine aluminum or any other suitable material. Included in the base plate may be machine cavity 60 for receiving the MCM 14. The depth of this cavity may be the same as the width of the MCM in the machine and may be of such minimum tolerance that there is little if any movement of the MCM when placed in the cavity. Extending from the floor of the cavity 60 are alignment pins 62. These pins may be incorporated in the base plate structure in any number of ways. The alignment pins are positioned such that they pass through the alignment poles of the other components of the electronic assembly in the stacked configuration.

Figure 6:
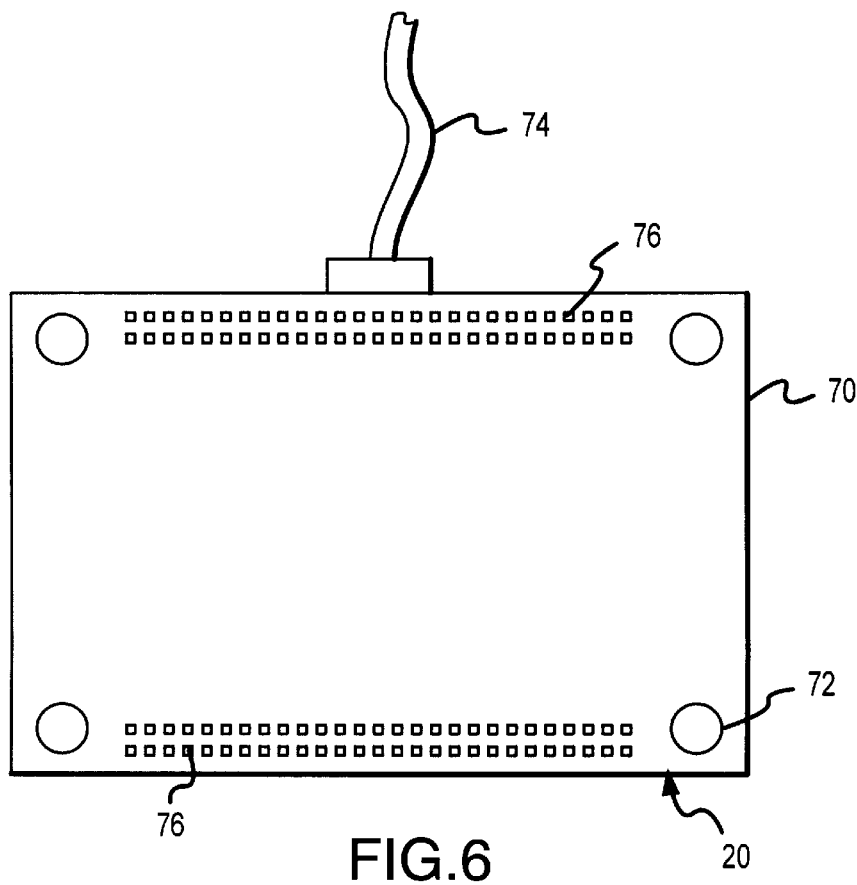
FIG. 6 discloses a bottom view of the actuator assembly.

Disclosed in FIG. 6 is a bottom view of the force actuator assembly 20. This device when used in conjunction with the alignment pins extending from the base plate structure provides for applying a compressive force to the stacked electronic assembly. The force actuator device may include a number of external or electronic contacts 76 which when the electronic assembly is in the stacked configuration, contact external electronic contacts on the exterior of the circuit card interface. The force actuator includes a body structure 70 which may be constructed of aluminum and which on the inside includes various electronics for measuring the quality of the electrical contacts in the stacked configuration as well as various mechanized actuators which are employed for applying a compressive force to the electronic assembly in a stacked configuration.

The bottom of the actuator device includes holes 72 which are configured to receive the alignment pins. Extending from the actuator assembly are electrical lines 74 which may provide an electrical connection to an external power source or other remotely located electronic devices.

Figure 7:
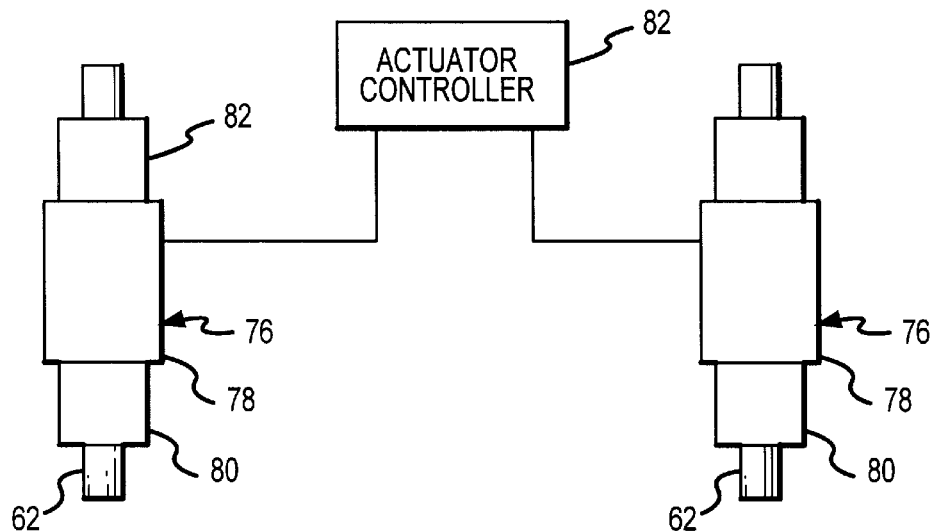
FIG. 7 discloses a side of view of the piezoceramic inchworm actuator.

In one configuration of the invention, the mechanical actuators which employed to apply compressive force to stacked electronic assembly may be a piezoceramic inchworm motor. Disclosed in FIG. 7 is a side view of the inchworm motors when engaging the alignment pins 62. Each inchworm motor 76 includes a central clamping actuator 78 as well as clamping actuator 80 and 82. Control voltages for operations of the inchworm motor are provide through the actuator controller 82. The inchworm motor acts to move the alignment pin in a desired direction. This is done in a manner which is well known in the art. Through application of this force on the alignment pin(s) the actuator device may apply a compressive force on the stacked electronic assembly.

Figure 8:
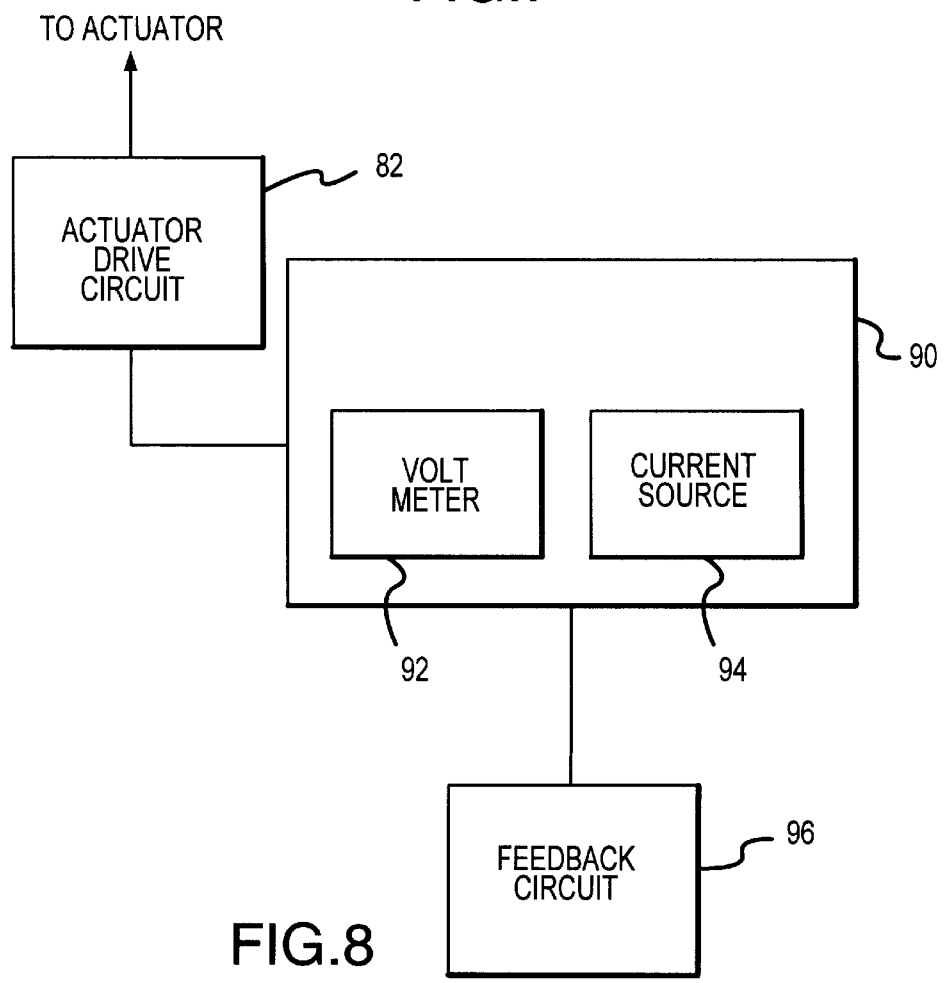
FIG. 8 disclosed a system diagram for the actuator system.

Disclosed in FIG. 8 is a system diagram for the force actuator described herein. The actuator control of electronics may be implemented through use of a microprocessor device which includes a number of external ports through which electrical connections may be made. One external contact for the controller may be to the actuator drive circuit 82 which as described above provides control signal for driving the inchworm motors. Incorporated into the controller 90 are processing modules which act as a voltmeter 92 and a current source 94. The voltmeter 92 is employed to measure the voltage drive over a feedback circuit 96 which has been incorporated in the electronic assembly. The current source 94 is employed to transmit a current stimuli over the feedback circuit in response to a received manual control signal from a remotely located user interface or automatically at programmed pre-determined intervals.

As described above, the feedback circuit is incorporated in the components of the electronic assembly. This may be done during assembly of the individual components. The feedback circuit may comprise designated electrical contacts on the external surface of the components as well as conductive traces which pass through the components. The electrical contacts on the body of the actuator assembly are aligned such that the designated electrical contact for the feedback circuit may be contacted when the electronic assembly is in a stacked configuration.

Figure 9:
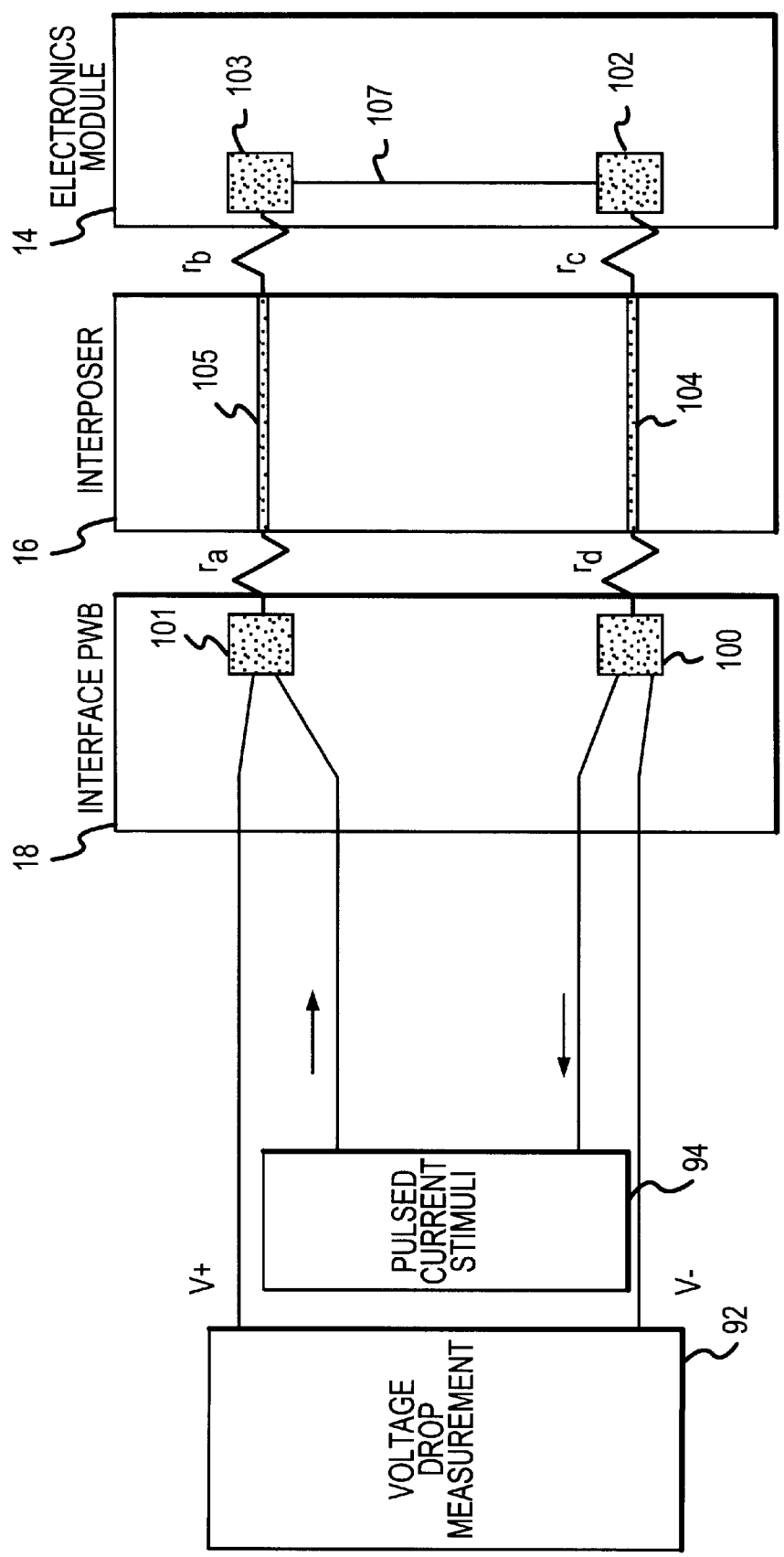
FIG. 9 discloses a circuit diagram for the feedback circuit including the current source and voltmeter.

Disclosed in FIG. 9 is a circuit diagram which graphically shows the conductive traces and electrical contacts which run from the current source 94 through the components of the stacked electronic assembly. Further shown is the connection of the voltmeter 92 which measures the current drop across the feedback circuit. In particular, it is shown that the circuit card interface 18 includes at least two electrical contacts 100 and 101 which are an electrical connection with the voltmeter and current source. Further running through the interposer 16 are electrical traces 104 and 105 which are specially adapted for use in the feedback circuit. In MCM 14 are electrical contacts 102 and 103 as well as conductive trace 107. As can be seen, the electrical contacts and conductive traces through the various components of the electronic components of the electronic assembly comprise a feedback loop.

As is well known, when two electrical contacts or conductive metals are put in physical contact, although current may pass from one conductive metal to the other, this type of connection isn't perfect and its conductive characteristics can change over time. The surface of the metals which are in contact can degrade over time due to the electrical current passing between. As such, periodically moving the contact and/or varying the pressure of the contact may change the conductive characteristics of the particular connection. The feedback circuit described in FIG. 9 is a test circuit which is employed to measure the resistive characteristics ($r_a$, $r_b$, $r_c$, and $r_d$) between electrical contacts.

In operation, the first step in employing the electronic assembly is assembling individual parts. Turning again to FIG. 1, during the assembly process, each of the individual elements (14, 16, 18 and 20) are aligned with the base plate structure 12 such that the alignment holes through each individual element will pass over the alignment pins extending from the base plate structure 12. Each individual element is then placed over the alignment pins until they are supported by the base plate structure in a stacked configuration. The tolerances for manufacturing the individual elements should be such that once in the stacked configuration, the electrical contacts on each component are properly aligned to provide for proper functioning of the overall system.

Once the electronic assembly is in the stacked configuration, the inchworm motor(s) in the force actuator assembly 20 may be activated such that a pre-determined compressive force is applied to the stacked electronic components between the actuator assembly 20 and the base plate structure. As was described above, the piezoceramic inchworm motors apply a compressive force to the electronic components by engaging the alignment pins and forcing the body of the force actuator assembly 20 towards the base plate structure 12. Although in the configuration shown in FIG. 1, the force actuator comprises peizeoceramic inchworm motors, one skilled in the art would realize that other types of compressive force actuators may be employed. For example, it is conceivable that a number of actuators may be employed which clamp on to the external surfaces of the electronic assembly described above. Each actuator would in turn be controlled by a clamping actuator drive circuit incorporated in to controller electronics.

Figure 10:
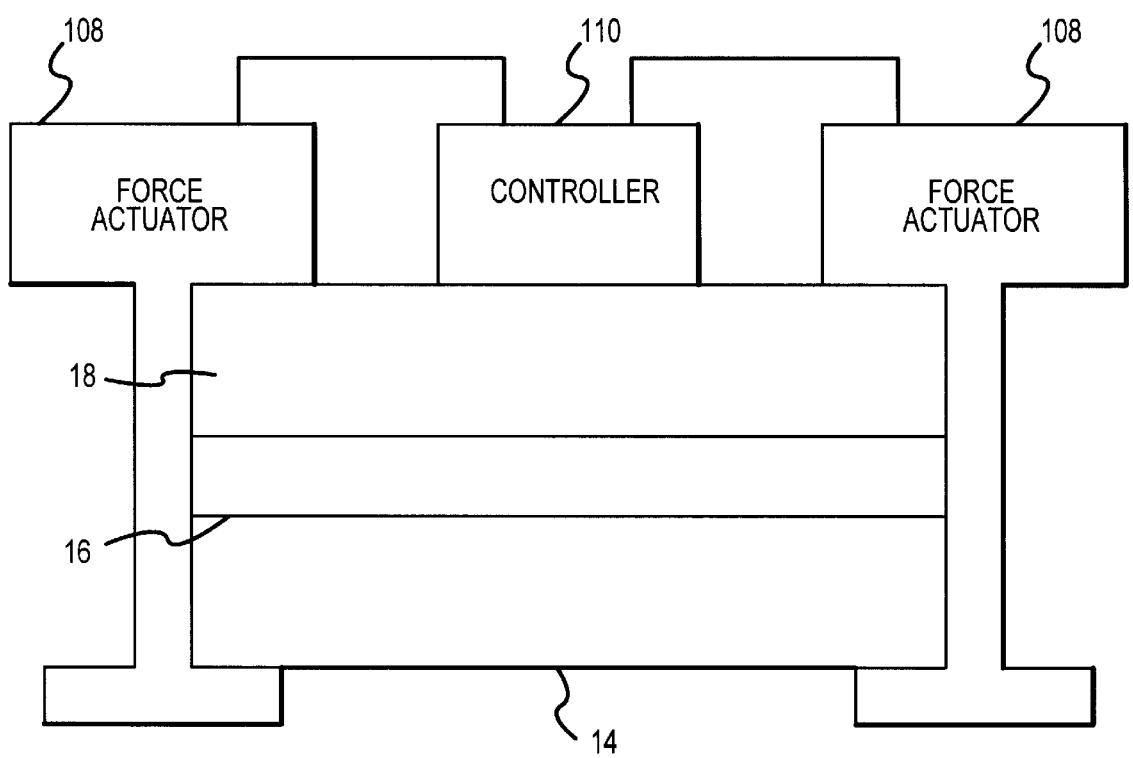
FIG. 10 discloses a alternate configuration for the force actuators.

This alternative configuration is disclosed in FIG. 10. As can be seen, instead of having the clamping actuator incorporated in to the housing 20, the compressive force may be applied by a number of external force actuators 108 which are attachable to external surfaces of the stacked electronic assemblies. The compressive force applied is monitored and controlled through controller 110 which also includes the electronics for transmitting a current over the feedback circuit and measuring the voltage drop. When it is desired to replace one of the components of the stacked electronic assembly, the force actuators may be removed and the component replaced.

Figure 11A:
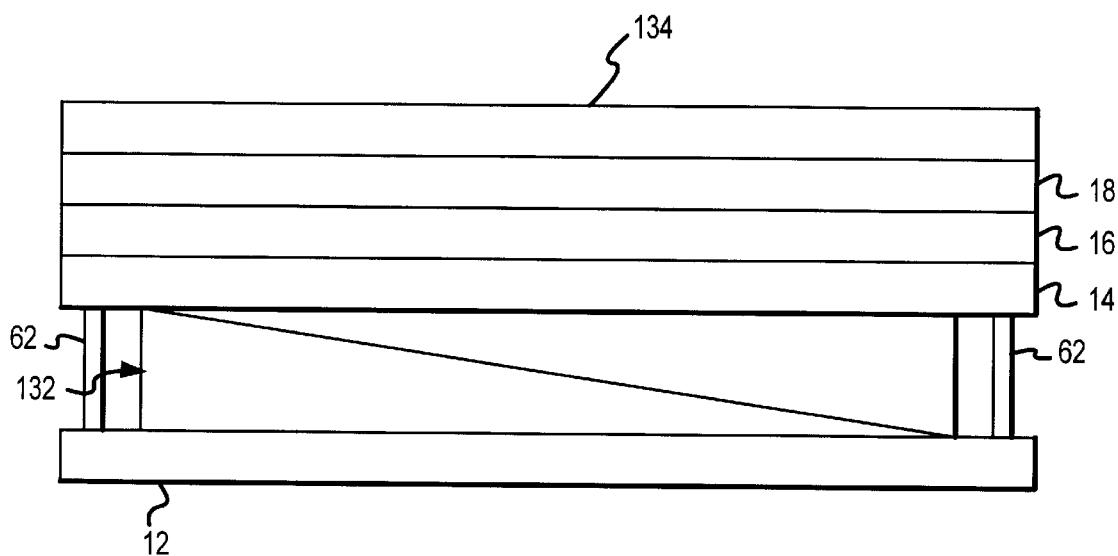
FIGS. 11a–d discloses yet another configuration which includes shape memory alloy motors.

Another configuration for applying a compressive force is disclosed in FIG. 11a–d. FIG. 11a discloses a side view of the stacked electronic assembly which includes a shape memory alloy motor 132 for applying the compressive force. Also included in the assembly are base plate structure 12, MCM 14, interposer 16, circuit card interface 18, and electronics housing 18. Extending upwards from the base plate structure 12 are alignment pins 62 which pass through alignment holes formed in the other components of the assembly. In this configuration the electronics assembly is configured to engage the alignment pins so that there is no relative movement between these components. This engagement may be released when access is desired to the individual components.

Figure 11B:
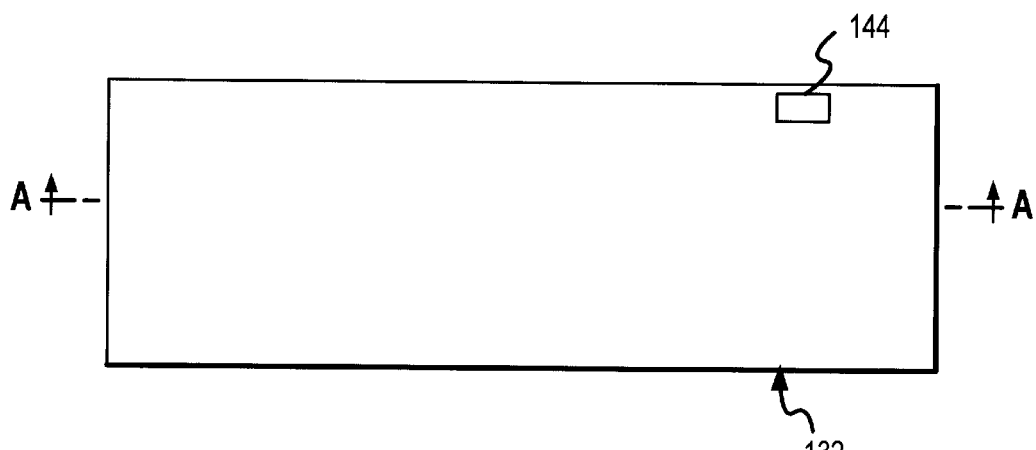
Figure 11C:
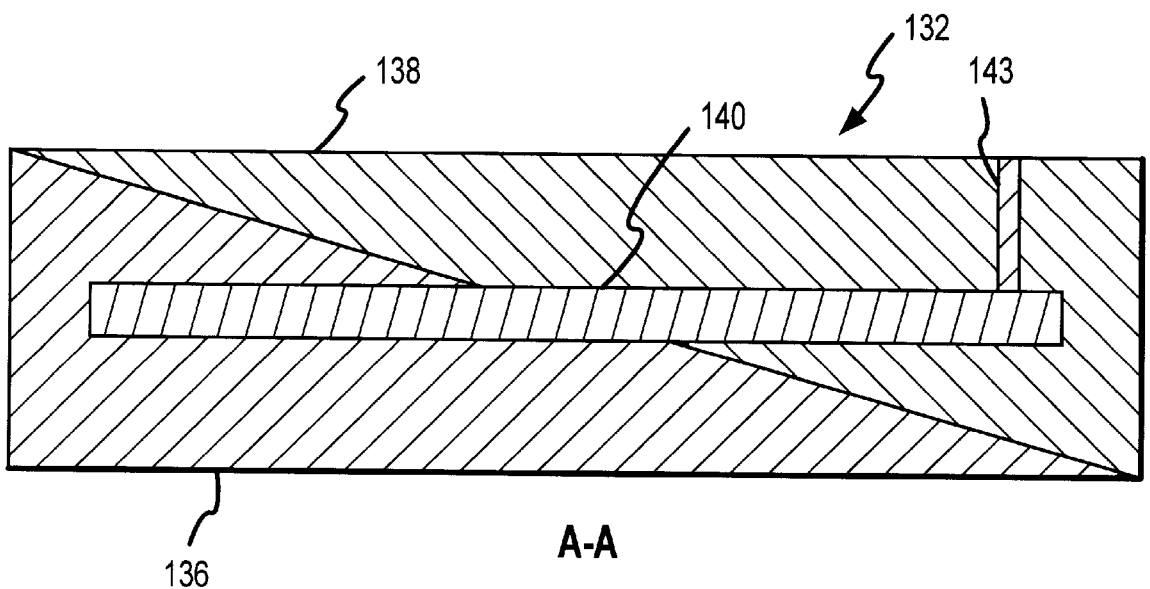

FIG. 11b discloses a top view of the shape memory motor 132 which shows in particular where the cross sectional view disclosed in FIG. 11c is taken. Also shown is external contact 144 which provide for establishing an electrical connection with electronic assembly 134 through the interposer and circuit card interface. An electrical connection may also be established using electrical lines which run outside the assembly.

In FIG. 11c a cross sectional view of the shape memory alloy motor is shown. The motor includes lower and upper wedge portions, 136 and 138 respectively, as well as shape memory spring 140. The wedge portions may be made of a metallic material such as aluminum with a smooth exterior surface so that the wedge portions may move relative to each other while in physical contact. Each of the wedge portions includes an internal cavity which is formed to receive a portion of the shape memory spring 136 in the manner shown in FIG. 11c. Further included in the shape memory motor is conductive pathway 143 which acts to conduct electrical current from a remotely located power source to heating elements fixedly attached to the shape memory alloy spring.

Figure 11D:
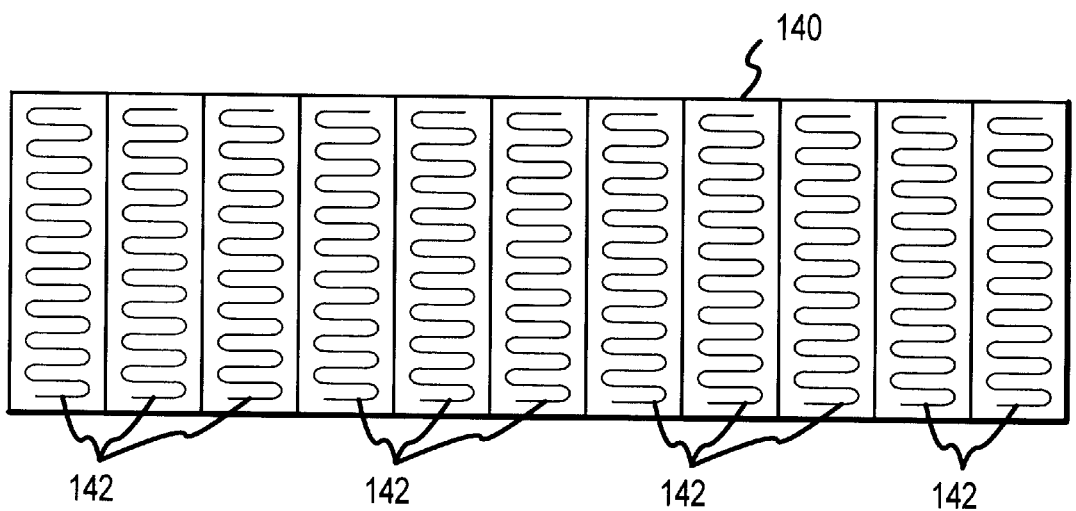

In FIG. 11d is a top view of the shape memory alloy spring 140 is disclosed which shows in particular the heating coils 142 fixedly attached to the spring. Each of the heating coils may be selectively activated in order to control the amount of compressive force applied to the electronic assembly. Each coil applies a predetermined amount of heat to a portion of the spring depending on the current which is conducted therethrough.

In operation, prior to installation of the shape memory motor in the assembly, the spring is trained to coil up when the temperature of the portion of the spring is above a set point, and to have a flat configuration when the heat is below that point. The training of shape memory alloy springs is well known in the art.

Once installed in the electronics assembly, the shape memory motor may be activated by the controller electronics. When this happens, current is conducted to one or more heating coils on the shape memory alloy spring which in turn heats a portion of the spring. Once the temperature of that portion of the spring rises above the set point, that portion of the spring will attempt to move to its trained shape. This coiling of the spring will in turn act to move the upper wedge 138 upwards along the sloped surface of the lower wedge 136. With the alignment pins locked into the electronics housing, this upward movement will act to apply a compressive force to the stacked electronic assembly. The amount of force applied will depend on the number of heating coils which are activated.

In order to reduce the force, selected numbers of the heating coils are deactivated which acts to cool a portion of the spring, wherein the cooled portion then returns to its original shape. If it is found that the cooling of the spring is not sufficient to remove the compressive force, counter springs may be included in the shape memory motor to provide a counter force to the coiling of the spring.

Once construction of the electronic assembly is completed (regardless of what force actuator is employed), the force actuator drive circuit may be activated such that the inchworm (or other) motors are signaled to apply a predetermined compressive force to the electronic assembly. This initial compressive force should be sufficient to hold the assembly together and provide for good electrical contact between the electrical components.

During normal operations of the electronic assembly, the current source may be periodically activated (either manually or automatically) such that a current of a pre-determined magnitude is transmitted over the feedback circuit. At this time, the voltmeter may then measure the voltage drop over the feedback circuit and the resistance may be calculated to determine whether there is good electrical contact between the electronic components. This is done through a 4-wire measurement of the resistance through the feedback circuit.

If it is determined that the overall resistance over the feedback circuit is too high, the force actuators may be activated and the compressive force on the electrical components may be increased. As the compressive force increases, measurements may be continually made until a desired level of resistance is reached. Once this desired level is reached, the compressive force may be maintained or even reduced as long as the desired amount of resistance is maintained.

As was mentioned above, the contacts through the interposer are Z shaped and gold plated. Further, is known that the interposer material is flexible. When the interposer is compressed between two contact pads, the Z-contact rotates slightly thus giving a highly desirable wiping motion on the two pads it is connecting. With this additional feature, the force actuator assembly may be employed to induce small cycling movements of compressive force on the electronic assembly such that there is a scrubbing action between the Z shaped contact through the interposer and the inter contact pads on the other electronic components such that the contacts are "scrubbed". This scrubbing action acts to remove any undesirable materials which may have accumulated on the contacts which would act to increase the resistance over the contact.

Programming may be included in the microprocessor for the force actuator assembly such that the above described process may be performed automatically on periodic basis. This process may also be initiated manually by issuing a command to the force actuator assembly from a remotely located user interface. The electronics assembly may be further configured such that if the resistance over the electronic circuit becomes too high and is not correctable through use of increased compressive force, a notification may be transmitted to the remotely located interface such that further analysis of the electronic assembly may be made with the ultimate result that the multichip module or other components are either repaired or replaced.

Figure 12:
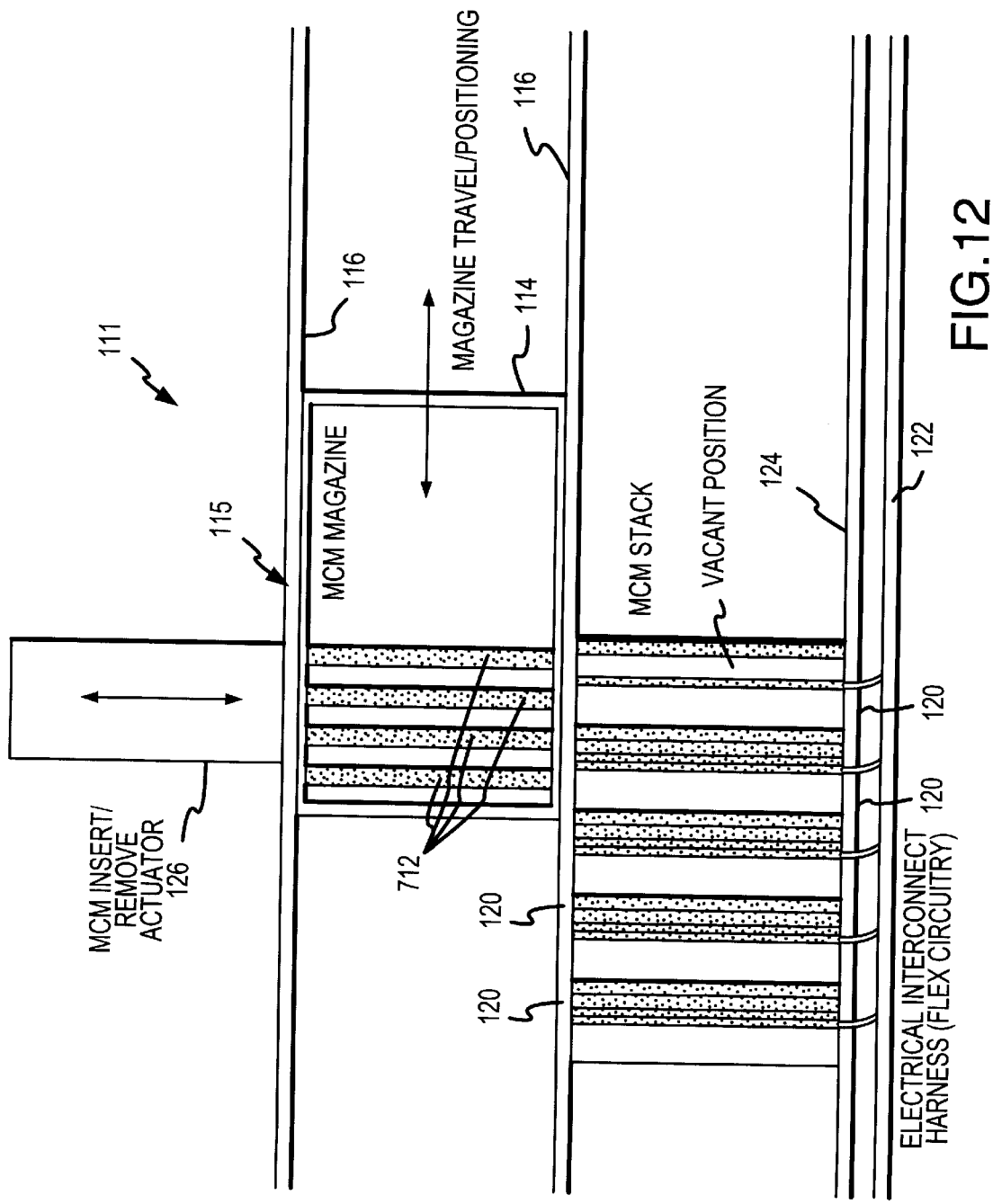
FIG. 12 discloses a side of view of the automated multichip module loading/unloading system.

Because of the easy replaceability of the components as described above, the electronic assembly described herein may be incorporated in an automated MCM loading/unloading apparatus 111 such as that disclosed in FIG. 12. As can be seen, each of the MCM stacks is initially installed in a black box type structure 124 which has a number of electrical interconnect harnesses which run from it to remotely located systems. Each multichip module stack includes the components described above which are the multichip module, the interposer, the circuit card interface, as well as the actuator assembly. The electrical harness 122 connects directly into the circuit card interface.

In connection with the black box structure 124 is a MCM replacement apparatus 115. Included in this apparatus are parallel rails 116 upon which a MCM magazine enclosure may run. The black box structure 124 includes an opening through which multichip modules may pass and be removed and replaced. Connected to the magazine 114 is a MCM insert-remove actuator 126 which includes the functionality to insert and retrieve multichip modules in response to receiving a control signal from a remotely located control system (not shown). In particular, this actuator is configured such that it may physically insert and/or remove a multichip module from a stacked electronic assembly.

When it is desired to remove a multichip module from a stack, a signal may be initially transmitted to the force actuator assembly of the particular stack such that the clamping motors are instructed to remove the compressive force on the electronic components. At this point, the alignment pins are released and the base plate structure may be moved away from the rest of the assembly and the insert/remove actuator employed to remove the selected multichip module. Once the MCM is removed, the magazine may then be positioned such that the insert/remove actuator may insert a new MCM in the particular electronic assembly. Once the MCM is in place, the base plate structure may be moved such that the alignment pins pass through all of the alignment holes of the components of the electronic assembly. At this point, the clamping motors of the force actuator assembly may then be instructed to clamp on to the alignment pins and being exerting a compressive force on the electronic assembly. At this point, the particular electronic assembly may resume normal operations which includes the periodic measurements of the resistance over the feedback circuit.

The foregoing description of the present invention has been presented for purposes of illustration and description. Furthermore, the description is not intended to limit the invention to the form disclosed herein. Consequently, variations and modifications commensurate with the above teachings, and the skill or knowledge of the relevant art, within the scope of the present invention. The embodiments described hereinabove are further intended to explain best modes known for practicing the invention and to enable others skilled in the art to utilize the invention in such, or other, embodiments and with various modifications required by the particular applications or uses of the present invention. It is intended that the appended claims be construed to include alternative embodiments to the extent permitted by the prior art.

What is claimed is:

1. An electronics apparatus comprising:
   a plurality of electronics components each with at least one external electrical contact wherein the plurality of electronic components are positionable such that the electrical contacts may contact each other and electrical signals may pass between each of the plurality of electronic components;
   a feedback circuit incorporated into the plurality of electronic components, wherein the feedback circuit includes at least one of the external electrical contacts on each of the plurality of electronic components;
   a resistance measurement device in electrical contact with the feedback circuit which is employable to measure resistance over the feedback circuit and generate a control signal whose magnitude is indicative of the measured resistance over the feedback circuit; and
   at least one force actuator in connection with the plurality of electronic devices and electrical connection with the resistance measurement device such that a compressive force may be applied to the plurality of electronic components in response to receipt of the control signal.

2. The apparatus of claim 1 wherein the plurality of electronic components comprise: a multichip module (MCM), an interposer, and a circuit card interface.

3. The apparatus of claim 2 wherein the plurality of electronic components are in a stacked configuration such that electrical connections are established between the contact through the at least one external electrical contact on each of the plurality of electronic components.

4. The apparatus of claim 3 wherein the interposer is positioned between the multichip module and the circuit card interface so as to provide electrical connections between the multichip module and the circuit card interface.

5. The apparatus of claim 4 wherein the at least one electrical contact of the interposer passes from one exterior surface of the interposer to an opposing exterior surface, wherein the at least one contact is shaped so as to provide lateral of a portion of the at least one electrical contact when the compressive force is applied.

6. The apparatus of claim 5 wherein the at least one electrical contact of the interposer is "Z" shaped.

7. The apparatus of claim 2 further comprising a base plate structure upon which the multichip module, the interposer, and the circuit card interface are positionable.

8. The apparatus of claim 7 wherein the base plate includes a plurality of alignment pins which extend therefrom and the plurality of electronic components each include a plurality alignment holes though which the plurality of alignment posts may pass in order to establish physical contact between the plurality of electrical contacts on the exterior surface of the electronic components.

9. The apparatus of claim 8 wherein the force actuator comprises at least one piezoceramic inchworm which is configure to receive the at least one alignment pin and to exert a force on the alignment pin in response to the control signal.

10. The apparatus of claim 1 wherein the force actuator comprises a shape memory alloy motor.

11. The apparatus of claim 1 wherein the resistance measurement system includes a pulsed current stimuli source which is employed to transmit a predetermined current over the feedback circuit.

12. The apparatus of claim 11 wherein the resistance measurement device is configure to transmit the predetermined current over the feedback circuit at predetermined intervals.

13. The apparatus of claim 11 wherein the resistance measurement device is configured to transmit the current over the feedback circuit in response to manual input signal received from a remotely located user interface.

14. A method of maintaining electrical connections between a plurality of electrical components comprising:
   positioning the plurality of electronic devices such that electrical contact is established between at least one electrical contact located on exterior surface of each of the plurality of electronic components, wherein the plurality of electronic devices are configured such when the plurality of electronic devices are in contact, a feedback circuit is created which includes the at least one electrical contact on each of the plurality of electronic components;

transmitting a electrical signal over the feedback circuit of a known magnitude;

measuring the voltage drop over the feedback circuit and generating a control signal which is proportional to the measure voltage drop; and applying a compressive force to the plurality electronic devices so that measured voltage drop across feedback circuit is maintained a predetermined level.

15. The method of claim 14 wherein the plurality of electronic components comprise: a multichip module, an interposer, and a circuit card interface.

16. The method of claim 15 wherein the at least one electrical contact for the interposer passes from one exterior opposing surface of the interposer to another.

17. The method of claim 16 wherein the step of applying a compressive forces induces lateral movement in a portion of the at least one external electrical contact in the interposer.

18. The method of claim 16 wherein the at least one electrical contact through the interposer is "Z" shaped.

19. The method of claim 14 wherein the step of positioning the plurality of electronic includes:

providing a base plate structure which includes a plurality of alignment posts incorporating a plurality of alignment holes in each of the at least one electronic devices; and placing each of the plurality of electronic components over the alignment posts in a predetermined order such that the at least one external electrical contacts in each of the electronic components are in electrical contact.

20. The method of claim 14 wherein the transmitted electrical signal is a pulsed current stimuli.

21. The method of claim 20 wherein the electrical signal is pulsed automatically at predetermined intervals.

22. The method of claim 20 wherein the electrical signal transmitted in response to receipt of a manual input signal received from a remotely located user interface.

23. The method of claim 14 wherein the compressive force is applied to the electronic assembly through use of a plurality of piezoceramic inchworms which contact an apply a linear force to at least one of the alignment posts.

24. The method of claim 14 wherein the compressive force is applied through use shape memory alloy motor.

25. The method of 15 wherein the multichip module can be replaced through a process comprising the steps of:

removing the compressive force;

moving the support structure such that the alignment posts are removed from the alignment holes;

positioning a new multichip module relative the support structure, interposer, circuit card interface;

inserting alignment post through all the elements; and reapplying the compressive force to the electronic assembly.

26. The method of claim 25 wherein the multichip module is replaceable through use of an automated process.

27. An apparatus for maintaining electrical connections between a plurality of electronic components in an electronics assembly comprising:

an electrical feedback circuit incorporated into the plurality of electronic components through which an electrical signal may pass, wherein the feedback circuit includes at least one electrical contact on an exterior surface of each of the plurality of electrical components;

a power source for transmitting an electrical signal of known magnitude through the electrical feedback circuit;

a voltage measuring device which measures the voltage drop over the electrical feedback circuit through measurement of the electrical signal transmitted by the power source; and an actuator which is connectable to the voltage measuring device, wherein the actuator is configurable to apply a compressive force to the plurality of electronic devices to affect the resistance measured over the feedback circuit.

28. The apparatus of claim 27 wherein the electronics assembly comprises a stacked structure which includes a circuit card interface, an interposer, and multichip module wherein the interposer is positioned between the circuit card interface and the multichip module so as to provide at least one conductive pathway between these components.

29. The apparatus of claim 28 wherein the conductive pathway through the interposer comprises segment of a conductive metal shaped so as to move a lateral direction upon application of the compressive force.

30. The apparatus of claim 29 wherein the conductive pathway is "Z" shaped so as to provide lateral movement when the compressive force is applied to the electronic assembly.

31. The apparatus of claim 28 wherein the electronic assembly further includes a baseplate structure from which at least one alignment pin extends wherein the circuit card interface, the interposer, and the multichip module further include alignment holes through which the alignment posts may pass when the electronic assembly is in a stacked configuration.

32. The apparatus of claim 27 wherein the force actuator comprises a self contained housing which is configured to received the at least one alignment pin, wherein the force actuator further comprises at least piezoceramic inchworm is configure to exert a linear force on the alignment pin so as to apply the compressive force to the electronic assembly.

33. The apparatus of claim 32 wherein the force actuator comprises a shape memory alloy motor.

34. The apparatus of claim 27 wherein the power source transmits a pulsed current stimuli over the feedback circuit.

35. The apparatus of claim 34 wherein the pulsed current is transmitted over the feedback circuit automatically at predetermined intervals.

36. The apparatus of claim 27 further including a microprocessor which incorporates the voltage measurement device, power source, and drive circuit for the actuator.

37. The apparatus of claim 27 further including a multichip module stack device wherein a plurality of the electronic assemblies may be positioned and interconnected wherein the system includes an automated system for replacing multichip modules (expand).

* * * * *

UNITED STATES PATENT AND TRADEMARK OFFICE
CERTIFICATE OF CORRECTION

PATENT NO. : 6,522,518 B1
DATED : February 18, 2003
INVENTOR(S) : Barnett

It is certified that error appears in the above-identified patent and that said Letters Patent is hereby corrected as shown below:

<u>Title page,</u>
Item [73], delete the word "Lockhead", and insert therefor -- Lockheed --.

<u>Column 8,</u>
Line 46, delete the word "peizeoceramic", and insert therefor -- piezoceramic --.

<u>Column 12,</u>
Line 24, after the word "lateral", insert -- movement --.

<u>Column 13,</u>
Line 1, delete the word "a", and insert therefor -- an --
Line 8, after the word "maintained", insert -- at --;
Line 16, delete the word "forces", and insert therefore -- force --;
Line 22, after the word "electronic", insert -- devices --;
Line 36, after the word "signal", insert -- is --;
Line 40, delete the word "an", and insert therefor -- and --.

<u>Column 14,</u>
Line 42, delete the word "received", and insert therefor -- receive--;
Line 43, after the word "least", insert -- a --;
Line 43, after the word "inchworm", insert -- which --;
Line 44, delete the word "configure", and insert therefor -- configured --;
Line 60, delete the word "(expand)".

Signed and Sealed this

First Day of July, 2003

JAMES E. ROGAN
*Director of the United States Patent and Trademark Office*